(12) United States Patent
Hsieh et al.

(10) Patent No.: US 8,342,870 B2
(45) Date of Patent: Jan. 1, 2013

(54) BURN-IN-TEST SOCKET INCORPORATING WITH ACTUATING MECHANISM PERFECTING LEVELING OF DRIVING PLATE

(75) Inventors: Wen-Yi Hsieh, New Taipei (TW); Ke-Hao Chen, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 92 days.

(21) Appl. No.: 13/045,546

(22) Filed: Mar. 11, 2011

(65) Prior Publication Data

US 2011/0223791 A1    Sep. 15, 2011

(51) Int. Cl.
*H01R 13/62* (2006.01)
(52) U.S. Cl. .......................... 439/331; 439/73
(58) Field of Classification Search .................. 439/330, 439/331, 73
See application file for complete search history.

(56) References Cited

U.S. PATENT DOCUMENTS

| | | | |
|---|---|---|---|
| 7,722,376 B2 * | 5/2010 | Kobayashi | 439/331 |
| 7,866,987 B2 * | 1/2011 | Chen | 439/73 |
| 7,878,837 B2 | 2/2011 | Hsieh et al. | |
| 7,946,881 B2 * | 5/2011 | Hsieh et al. | 439/487 |

* cited by examiner

*Primary Examiner* — Hien Vu
(74) *Attorney, Agent, or Firm* — Wei Te Chung; Ming Chieh Chang

(57) ABSTRACT

A socket connector (100) comprises a socket body (5), a plurality of contacts (3) received in the socket body (5), a lid (1) movably mounted on the socket body (5) and moving up and down along a vertical direction, a moving plate (4) movably mounted upon the socket body (5) and moving along a horizontal direction and an operating lever (2) located between the lid (1) and the moving plate (4), the operating lever (2) comprises a press member (22), the press member (22) presses on the top surface of the moving plate (4) to prevent the floating of the moving plate (4) in the vertical direction.

10 Claims, 5 Drawing Sheets

BURN-IN-TEST SOCKET INCORPORATING WITH ACTUATING MECHANISM PERFECTING LEVELING OF DRIVING PLATE

BACKGROUND OF THE INVENTION

1. Field of the Invention

The present invention relates to a socket connector for testing an IC (Integrated Circuit) package, and more particularly to a socket connector having an actuating mechanism to prevent the movement of the moving plate in a vertical direction during the movement of the moving plate along the horizontal direction.

2. Description of the Prior Art

U.S. Pat. No. 7,878,837 issued to Hsieh et al. on Feb. 1, 2011 discloses a socket connector for testing an IC package comprising a socket body 2, a moving plate 3 movably mounted within the socket 2, a lid 4 mounted above socket body 2, a plurality of contact terminals positioned in the socket body 2 and the moving plate 3, and an U-shaped operating lever 6 located between the lid 4 and moving plate 3. The moving plate 3 comprises a first side, a second side opposite to the first side, a third side connecting with the first side and the second side, and a fourth side opposite to the third side. The first side, the second side and the third side each comprises a pair of hooks interlocked to the socket body to secure the moving plate 3 on the socket body 2. When the IC is disposed therein, the operating lever 6 is depressed downwardly, and then the moving plate 3 is driven to move along a horizontal direction accordingly. Thus, an intended electrical connection is established between the IC and the contact terminals.

However, because the operating lever 6 is set on the fourth side of the moving plate 3, there is no space to provide hook or the like on the fourth side, as a result, there is no retention force provided between the fourth side of the moving plate 3 and the socket body. In used, the moving plate 3 near the fourth side is easy pop up along a vertical direction. Thus the contact terminals will disengage from with the IC, which effects the electrical connection between the IC and the contact terminals.

Therefore, It is necessary to create a new socket connector having an improved operating lever to overcome the problems mentioned above.

SUMMARY OF THE INVENTION

Accordingly, an object of the present invention is to provide a socket connector having an improved actuating mechanism capable of preventing the pop up of the moving plate in a vertical direction.

In order to achieve the object set forth, a socket connector comprises a socket body, a plurality of contacts received in the socket body, a lid movably mounted on the socket body and moving up and down along a vertical direction, a moving plate movably mounted upon the socket body and moving along a horizontal direction and an operating lever located between the lid and the moving plate, the operating lever comprises a press member, the press member pressed on the top surface of the moving plate to prevent the movement of the moving plate in the vertical direction.

BRIEF DESCRIPTION OF THE DRAWINGS

Other objects, advantages and novel features of the present invention will become more apparent from the following detailed description when taken in conjunction with the accompanying drawings, in which.

DESCRIPTION OF PREFERRED EMBODIMENT

Reference will now be made to the drawings to describe the present invention in detail.

Figure 1:
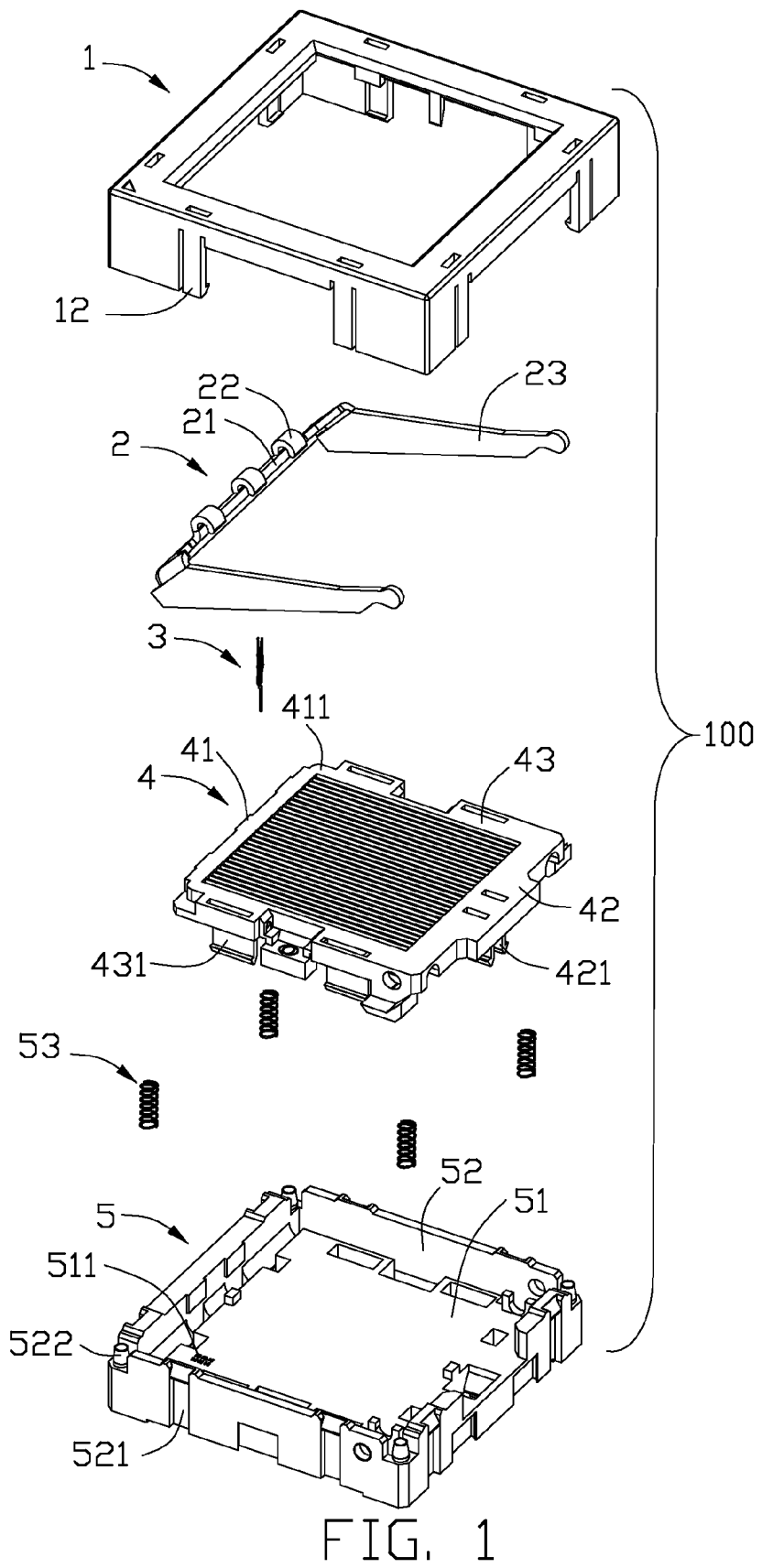
FIG. 1 is an exploded, perspective view of the socket connector in accordance with the preferred embodiment of the present invention.

Referring to FIG. 1, a socket connect 100 made in accordance with the present invention is provided for receiving an IC package. The socket connector 100 includes a socket body 5, a moving plate 4 movably mounted within the socket body 5, a lid 1 mounted above socket body 5 and an operating lever 2 located between the lid 1 and moving plate 4. Four springs 53 are provided and located between the lid 1 and the socket body 5. In addition, a plurality of terminals 3 are mounted in the socket body 5 and inserted into the moving plate 4.

The lid 1 is configured with a frame structure and comprises a latch 12 interlocked with the socket body 5 to position it on the socket body 5. The lid 1 is able to be pressed downwardly against the springs 53 and actuates the operating lever 2, which then moves pivotally and drive the moving plate 4 to move along a horizontal direction. And when the lid 1 is released, the lid 1 is returned to an original position under the elastic force released from the compressed springs 53.

The socket body 5 has a base 51 and four sidewalls 52 surrounding the base 51. The base 51 comprises a plurality of passageways 511 for receiving the contacts 3. The base 51 and the sidewalls 52 together form a cavity to receive the moving plate 4. The dimension of cavity is a bit larger than that of the moving plate 4 so that the moving plate 4 is movable within the cavity. The sidewall 52 comprises a post 522 and a recess 521. The compressed spring 53 is positioned on the post 522 and the latch 12 of the lid 1 is positioned in the recess 521 and interlocked with the socket body 5.

The moving plate 4 is received in the cavity of the socket body 5 and comprises a plurality of passageways 411 for receiving the contacts 3. The moving plate 4 comprises a first end 41, a second end 42 opposite to the first end 41 and a third end 43 connecting the first end 41 and the second end 42. The second end 42 comprises a first hook 421 and the third end 43 comprises a second hook 431 extending downwardly and hooks with the socket body 5, to position the moving plate 4 on the socket body 5 and prevent the movement of the second end 42 and the third end 43 of the moving plate 4 in the vertical direction.

The operating lever 2 is assembled to the first end 41 of the moving plate and is featured with a substantially U-shaped configuration. The operating lever 2 includes a pair of lever bars 23 and a pushing bar 21 interconnecting to the lever bars 23. The pushing bar 21 is located on the first end 41 of the moving plate 4 and the pair of lever bars 23 is located on the third end 43 of the moving plate 4. The pushing bar 21 comprises a pushing section and three press members 22 extending from the pushing section. In this embodiment, the press members 22 are configured with semi-circular shape. Also, the shape and the number of the press member 22 can be set according to the application.

Figure 2:
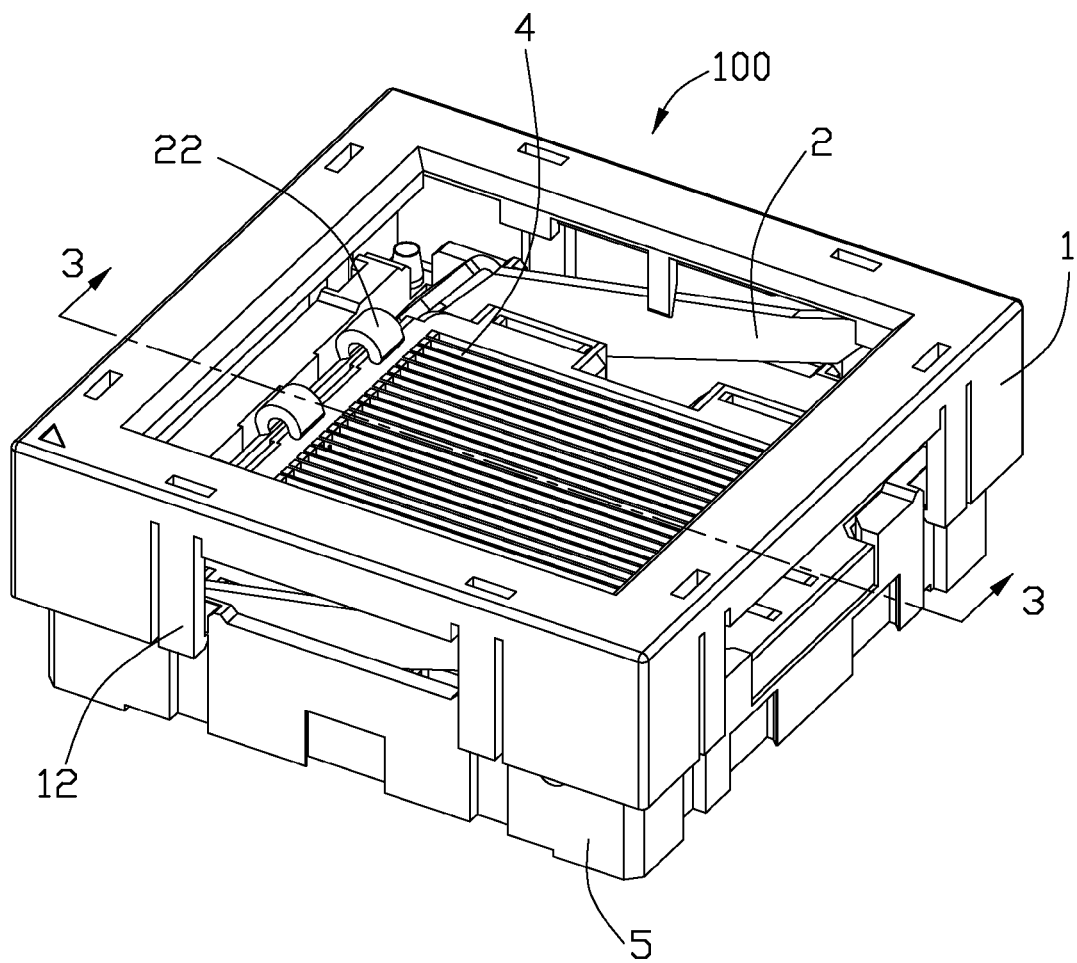
FIG. 2 is an assembled, perspective view of a socket connector in accordance with a preferred embodiment of the present invention, showing the operating lever in a first state.
Figure 3:
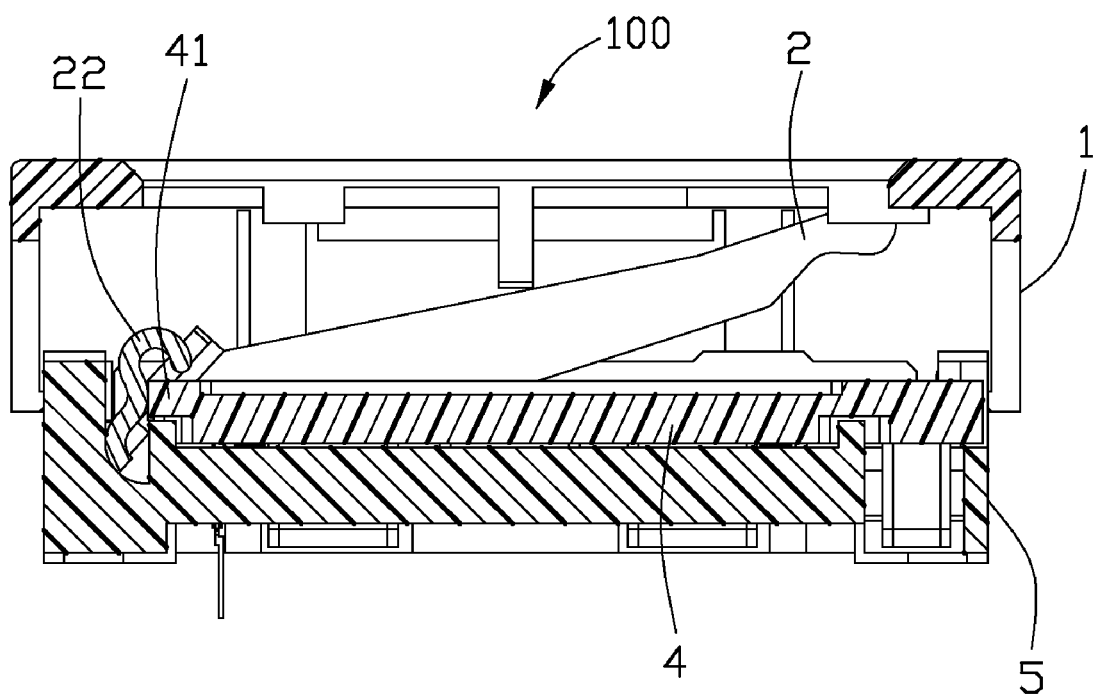
FIG. 3 is a sectional view of the socket connector taken along line 3-3 of FIG. 2.
Figure 4:
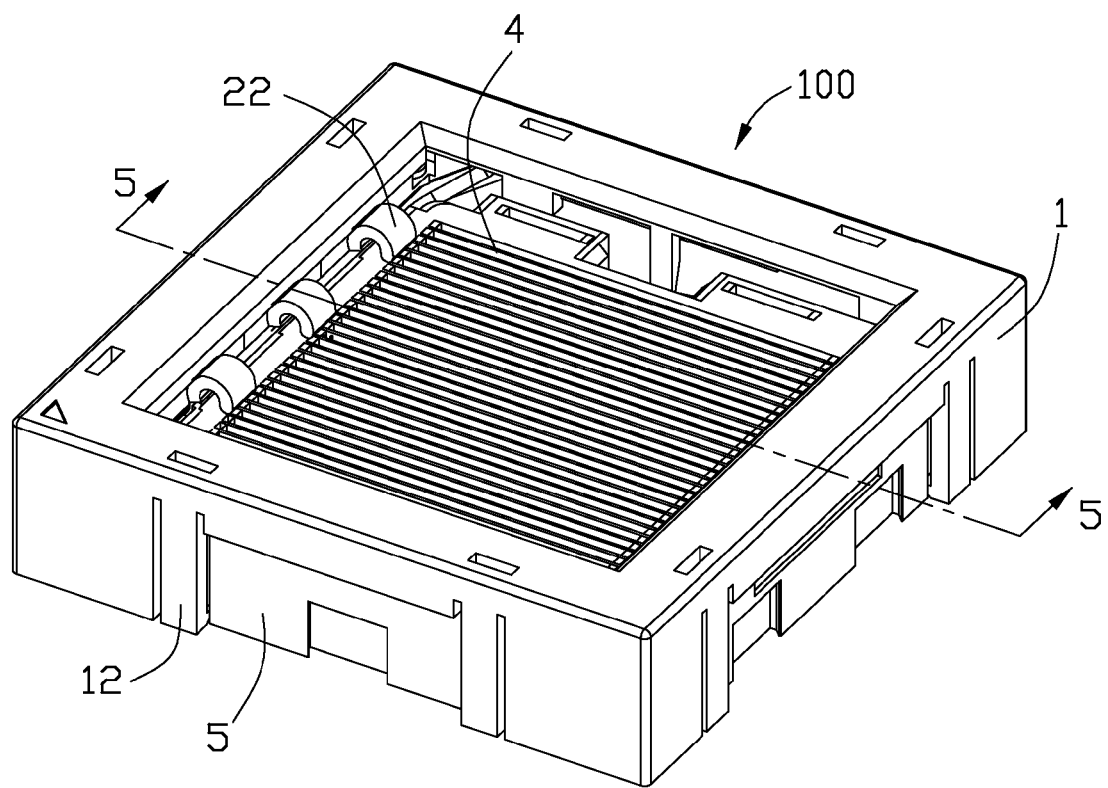
FIG. 4 is an assembled, perspective view of a socket connector in accordance with a preferred embodiment of the present invention, showing the operating lever in a second state.
Figure 5:
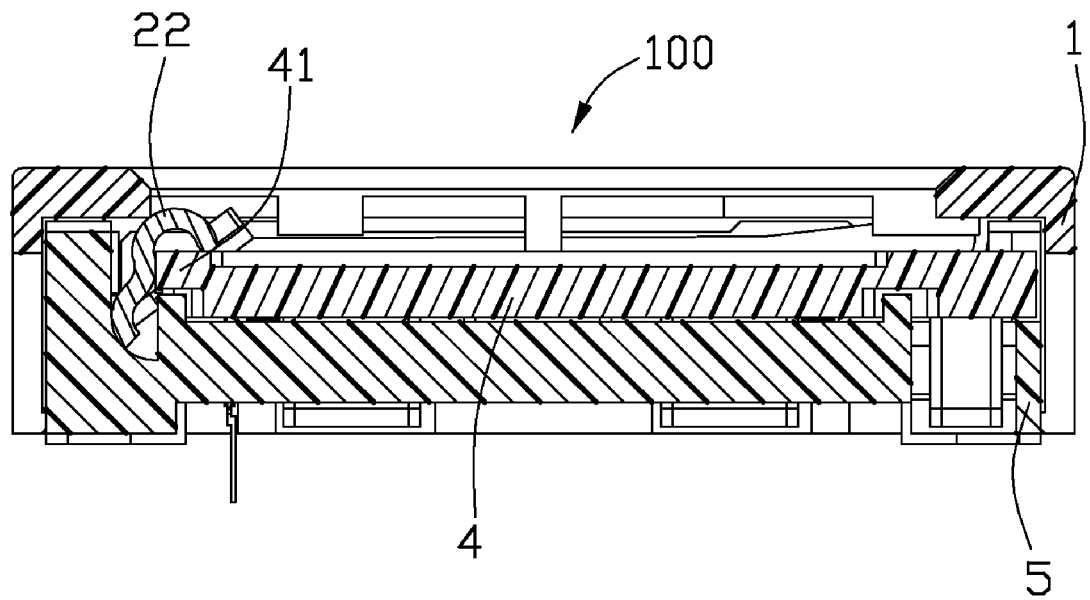
FIG. 5 is a sectional view of the socket connector taken along line 5-5 of FIG. 4.

Hereafter is detailed description about the operation and function of the socket connector 1. FIG. 2 and FIG. 3 show an initial state of the socket connector 100 in which the lid 1 is located at an upper most position. And particularly referring to FIG. 4 and FIG. 5, when press the lid 1 downwardly against the compressed springs 53, the operating lever 2 is pivotally moved, and the push bar 21 is rotated downwardly toward the moving plate 4 and the pushing section abuts against the moving plate 4 to urge the moving plate 4 to move along the horizontal direction. And simultaneously, the press members 22 will press on the first end 41 of the moving plate 4 to prevent the movement of the first end 41 of the moving plate 4 in the vertical direction.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector comprising:
 a socket body;
 a plurality of contacts received in the socket body;
 a lid mounted on the socket body and moving up and down along a vertical direction;
 a moving plate mounted upon the socket body and moving along a horizontal direction; and
 an operating lever located between the lid and the moving plate, the operating lever comprising press members pressed on a top surface of the moving plate to prevent the movement of the moving plate in the vertical direction;
 wherein the moving plate comprises a first end, a second end opposite to the first end and a third end connecting the first end and the second end;
 wherein the operating lever includes a pair of lever bars and a pushing bar interconnecting to the lever bars;
 wherein the pushing bar is assembled to the first end of the moving plate and can push the first end to make the moving plate move along the horizontal direction the moving plate move along the horizontal direction;
 wherein the press members are formed on the pushing bar; and
 wherein each of the press members is a curve shaped.

2. The socket connector as claimed in claim 1, wherein the second end comprises a first hook and the third end comprises a second hook extending downwardly interlocked with the socket body.

3. The socket connector as claimed in claim 1, wherein the pushing bar comprises a pushing section, the press member extends from the pushing section.

4. A socket connector comprising:
 a socket body;
 a plurality of contacts received in the socket body;
 a lid movably mounted on the socket body and moving up and down along a vertical direction;
 a moving plate movably mounted upon the socket body and moving along a horizontal direction; and
 an operating lever located between the lid and the moving plate, the operating lever comprising a pair of lever bars and a pushing bar interconnecting to the lever bars, the pushing bar comprising a pushing section pushing the moving plate to move along the horizontal direction and press members extending from the pushing section pressed on the moving plate;
 wherein the moving plate comprises a first end, a second end opposite to the first end and a third end connecting the first end and the second end,
 wherein the pushing bar is assembled to the first end of the moving plate; and
 wherein each of the press members is a curve shaped.

5. The socket connector as claimed in claim 4, wherein the second end comprises a first hook and the third end comprises a second hook extending downwardly interlocked with the socket body.

6. A socket connector comprising:
 a socket body defining a component receiving cavity;
 a plurality of contacts disposed in the socket body with contacting sections upwardly extending toward the component receiving cavity;
 a lid mounted upon the socket body and up and down moveable relative to the socket body between upper and lower positions in a vertical direction; a moving plate mounted upon the socket body and back and forth moveable relative to the socket body between first and second positions in a horizontal direction;
 an operating mechanism located between the lid and the moving plate and defining a first section having a pushing member to push the moving plate toward the first position in the horizontal direction and a second section having pressing members to hold the moving plate downwardly toward the socket body when the moving plate is located in the first position;
 wherein the moving plate is moved to the first position when the lid is located at the lower position;
 wherein the operating mechanism is essentially a lever defining a pivot adjacent one end of the socket body in a front-to-back direction; and
 wherein each of the press members is a curve shaped.

7. The socket connector as claimed in claim 6, wherein the first section and the second section are located adjacent said end.

8. The socket connector as claimed in claim 7, wherein the first section and the second section are offset from each other in a transverse direction perpendicular to said front-to-back direction.

9. The socket connector as claimed in claim 8, wherein a plurality of springs are located between the lid and the socket body to urge the lid away from the socket toward the upper position.

10. The socket connector as claimed in claim 6, wherein said lever defines a free end located away from the pivot and engaged with the lid for interaction therebetween.

* * * * *